(12) United States Patent
Jing et al.

(10) Patent No.: US 12,389,572 B2
(45) Date of Patent: Aug. 12, 2025

(54) CONTAINER BASED DATA CENTER WITH AIR COOLING EQUIPMENTS

(71) Applicant: Beijing Bytedance Network Technology Co., Ltd., Beijing (CN)

(72) Inventors: Tangbo Jing, Beijing (CN); Jian Wang, Beijing (CN)

(73) Assignee: Beijing Bytedance Network Technology Co., Ltd., Beijing (CN)

(*) Notice: Subject to any disclaimer, the term of this patent is extended or adjusted under 35 U.S.C. 154(b) by 0 days.

(21) Appl. No.: 18/759,193

(22) Filed: Jun. 28, 2024

(65) Prior Publication Data
US 2024/0357776 A1    Oct. 24, 2024

Related U.S. Application Data

(63) Continuation of application No. PCT/CN2022/139017, filed on Dec. 14, 2022.

(30) Foreign Application Priority Data

Dec. 30, 2021  (CN) .......................... 202111658727.5

(51) Int. Cl.
H05K 7/20    (2006.01)

(52) U.S. Cl.
CPC ....... H05K 7/2079 (2013.01); H05K 7/20263 (2013.01); H05K 7/20272 (2013.01); H05K 7/20745 (2013.01)

(58) Field of Classification Search
CPC ............. H05K 7/2079; H05K 7/20263; H05K 7/20272; H05K 7/20745
See application file for complete search history.

(56) References Cited

U.S. PATENT DOCUMENTS

| 9,345,173 B2* | 5/2016 | Czamara | H05K 7/1488 |
| 9,763,365 B2* | 9/2017 | Stöcker | H05K 7/2079 |

(Continued)

FOREIGN PATENT DOCUMENTS

| CN | 102436292 A | 5/2012 |
| CN | 102736683 A | 10/2012 |

(Continued)

OTHER PUBLICATIONS

English translation of the written opinion of the international searching authority for PCT/CN2022/139017 (2023).*

(Continued)

*Primary Examiner* — Zachary Pape
(74) *Attorney, Agent, or Firm* — BakerHostetler

(57) ABSTRACT

The disclosure relates to a data center, including: an IT equipment container provided with a server rack therein, an air-cooling equipment container, the IT equipment container having IT coolant inlet and outlet ports, and IT air inlet and outlet ports, the IT equipment container being prefabricated with a coolant inlet pipe connecting the IT coolant inlet port to a coolant inlet of a server rack, a coolant outlet pipe connecting the IT coolant outlet port to a coolant outlet of the server rack, and an air duct connecting the IT air outlet port to an air outlet of the server rack, and the IT air inlet port being in communication with interior of the IT equipment container; and having air-cooling air inlet and outlet ports, the air-cooling air inlet port and outlet ports being docked with the IT air outlet port and the IT air inlet port, respectively.

11 Claims, 10 Drawing Sheets

(56) References Cited

U.S. PATENT DOCUMENTS

| | | | |
|---|---|---|---|
| 10,231,358 B1 * | 3/2019 | Gillooly | H05K 7/20381 |
| 2012/0258654 A1 | 10/2012 | Peng et al. | |
| 2013/0163185 A1 | 6/2013 | Gilges et al. | |
| 2016/0021792 A1 * | 1/2016 | Minegishi | H05K 7/20745 |
| | | | 165/281 |
| 2018/0324976 A1 * | 11/2018 | Gao | H05K 7/20836 |

FOREIGN PATENT DOCUMENTS

| | | |
|---|---|---|
| CN | 205610336 U | 9/2016 |
| CN | 205657361 U | 10/2016 |
| CN | 109247082 A | 1/2019 |
| CN | 109496112 A | 3/2019 |
| CN | 109974374 A | 7/2019 |
| CN | 111726964 A | 9/2020 |
| CN | 212362291 U | 1/2021 |
| CN | 213521301 U | 6/2021 |
| CN | 213934644 U | 8/2021 |
| CN | 215187964 U | 12/2021 |
| CN | 114745900 A | 7/2022 |
| DE | 102019127752 A1 | 4/2021 |
| JP | 2019-518252 A | 6/2019 |
| KR | 20180132029 A | 12/2018 |
| WO | WO 2013/070104 A1 | 5/2013 |
| WO | WO 2018/201425 A1 | 11/2018 |

OTHER PUBLICATIONS

International Patent Application No. PCT/CN2022/139017; Int'l Search Report; dated Mar. 3, 2023; 3 pages.

China Patent Application No. 202111658727.5; Office Action; dated Dec. 30, 2024; 21 pages.

European Patent Application No. 22914264.1; Extended European Search Report dated Feb. 28, 2025, 11 pages.

Japanese Patent Application No. 2024-539663, Office Action dated Jun. 3, 2025, 12 pages with machine translation.

Junzhi Y., "Warehouse-style, Micro-module, Container-style Data Center," Intelligent Buildings, Issue 182, 2015, 6 pages.

Second Office Action for Chinese Application No. 202111658727.5, mailed May 30, 2025, 22 pages with English language translation.

* cited by examiner

CONTAINER BASED DATA CENTER WITH AIR COOLING EQUIPMENTS

CROSS-REFERENCE OF RELATED APPLICATIONS

This application is a continuation of International Patent Application No. PCT/CN2022/139017, filed on Dec. 14, 2022, which claims the priority of a Chinese patent application submitted on Dec. 30, 2021, with application No. 202111658727.5 and entitled "DATA CENTER", both of which are incorporated in the present application by reference.

FIELD

The present disclosure relates to the technical field of a data center, in particular to a data center.

BACKGROUND

With the rapid rise of cloud computing, big data, the Internet of Things, and artificial intelligence, the demand for large data centers is surging, and their size is also increasing rapidly. Data centers typically comprise servers, network equipment, cooling systems, power supply and distribution systems, etc. The construction of data centers is complex, time-consuming, and costly. The long construction time and the use of large amounts of construction materials, such as reinforced concrete, in the construction process will also increase the carbon emissions associated with data center construction, which is not conducive to reducing the overall carbon emissions.

SUMMARY

The purpose of the disclosure is to provide a data center to solve the technical problems of related technologies.

In order to achieve the above purpose, the disclosure provides a data center. The data center comprises: an IT equipment container provided with a server rack therein, the IT equipment container having an IT coolant inlet port, an IT coolant outlet port, an IT air inlet port and an IT air outlet port, and the IT equipment container being prefabricated with a coolant inlet pipe connecting the IT coolant inlet port to a coolant inlet of the server rack, a coolant outlet pipe connecting the IT coolant outlet port to a coolant outlet of the server rack, and an air duct connecting the IT air outlet port to an air outlet of the server rack, and the IT air inlet port being in communication with interior of the IT equipment container.

An air-cooling equipment container is provided with air-cooling equipment therein, the air-cooling equipment container has an air-cooling air inlet port and an air-cooling air outlet port, the air-cooling air inlet port is docked with the IT air outlet port, the air-cooling air outlet port is docked with the IT air inlet port, and the air-cooling equipment is adapted to cool air flowing in from the air-cooling air inlet port, so that a temperature of air flowing out of the air-cooling air outlet port is lower than a temperature of the air flowing in from the air-cooling air inlet port.

Optionally, the air-cooling equipment comprises an air-liquid heat exchanger and a fan, the air-cooling equipment container has an air-cooling coolant inlet port and an air-cooling coolant outlet port, and the air-cooling equipment container is prefabricated with a heat exchange inlet pipe connecting the air-cooling coolant inlet port to a coolant inlet of the air-liquid heat exchanger, and a heat exchange outlet pipe connecting the air-cooling coolant outlet port and a coolant outlet of the air-liquid heat exchanger, the fan is adapted to cause air flowing in from the air-cooling inlet port to flow out of the air-cooling outlet port after passing through the air-liquid heat exchanger.

Optionally, the data center further comprises a heat dissipation equipment container, wherein the heat dissipation equipment container is provided with heat dissipation equipment therein, the heat dissipation equipment container has a heat dissipation coolant inlet port and a heat dissipation coolant outlet port, and the heat dissipation equipment container is prefabricated with a heat dissipation pipe connecting the heat dissipation equipment with the heat dissipation coolant inlet port and the heat dissipation coolant outlet port.

The heat dissipation coolant inlet port is connected to the IT coolant outlet port and the air-cooling coolant outlet port, the heat dissipation coolant outlet port is connected to the IT coolant inlet port and the air-cooling coolant inlet port, and the heat dissipation equipment is adapted to cause a temperature of coolant flowing out of the heat dissipation coolant outlet port to be lower than a temperature of coolant flowing in from the heat dissipating coolant inlet port.

Optionally, the heat dissipation equipment comprises a cooling tower and/or a first air conditioning unit.

Optionally, the heat dissipation equipment comprises a cooling tower which is an open cooling tower.

The data center further comprises a hydraulic equipment container, which is provided with a first liquid-liquid heat exchanger, a first water pump and a second water pump therein; the hydraulic equipment container has a first hydraulic coolant inlet port, a second hydraulic coolant inlet port, and a first hydraulic coolant outlet port and a second hydraulic coolant outlet port, wherein the hydraulic equipment container is prefabricated with a first pipe connecting a first coolant inlet of the first liquid-liquid heat exchanger with the first hydraulic coolant inlet port, a second pipe connecting a first coolant outlet of the first liquid-liquid heat exchanger with the first hydraulic coolant outlet port, a third pipe connecting a second coolant inlet of the first liquid-liquid heat exchanger with the second hydraulic coolant inlet port, and a fourth pipe connecting a second coolant outlet of the first liquid-liquid heat exchanger with the second hydraulic coolant outlet port.

The first hydraulic coolant inlet port is connected to the heat dissipation coolant outlet port, the first hydraulic coolant outlet port is connected to the heat dissipation coolant inlet port, the second hydraulic coolant inlet port is docked with the IT coolant outlet port and the air-cooling coolant outlet port, and the second hydraulic coolant outlet port is docked with the IT coolant inlet port and the air-cooling coolant inlet port.

The first water pump is arranged on the first pipe and/or the second pipe; the second water pump is arranged on the third pipe and/or the fourth pipe.

Optionally, the heat dissipation equipment comprises a cooling tower which is a closed cooling tower.

The data center further comprises a hydraulic equipment container, which is provided with a water pump therein, the hydraulic equipment container has a hydraulic coolant inlet port and a hydraulic coolant outlet port, the hydraulic equipment container is prefabricated with a fifth pipe connecting the water pump with the hydraulic coolant inlet port and the hydraulic coolant outlet port.

The hydraulic coolant inlet port is connected to the heat dissipation coolant outlet port, and the hydraulic coolant outlet port is docked with the IT coolant inlet port and the air-cooling coolant inlet port.

Optionally, the IT equipment container is further provided with a cooling capacity distribution unit therein, the cooling capacity distribution unit comprises a second liquid-liquid heat exchanger, the coolant inlet pipe comprises a first sub coolant inlet pipe and a second sub coolant inlet pipe, and the coolant outlet pipe comprises a first sub coolant outlet pipe and a second sub coolant outlet pipe, the first sub coolant inlet pipe connects the IT coolant inlet port with a first coolant inlet of the second liquid-liquid heat exchanger, the second sub coolant inlet pipe connects a first coolant outlet of the second liquid-liquid heat exchanger and the coolant inlet of the server rack, and the first sub coolant outlet pipe connects the IT coolant outlet port with a second coolant outlet of the second liquid-liquid heat exchanger, and the second sub coolant outlet pipe connects a second coolant inlet of the second liquid-liquid heat exchanger and the coolant outlet of the server rack.

Optionally, the IT equipment container further has a smoke vent.

Optionally, the IT equipment container is provided with a power distribution cabinet therein, the IT equipment container has an IT power input port, and the IT equipment container is prefabricated with a first cable connecting the IT power input port with the power distribution cabinet.

The data center further comprises a power distribution equipment container and a transformer equipment container, the power distribution equipment container is provided with power distribution equipment therein, the power distribution equipment container has a first power distribution input port and a power distribution output port, and the power distribution equipment container is prefabricated with a second cable connecting the power distribution equipment with the first power distribution input port and the power distribution output port, the transformer equipment container is provided with a transformer equipment therein, and the transformer equipment container has a third cable connecting the transformer equipment with a transformer input port and a transformer output port.

The first power distribution input port is adapted to be connected to a municipal power grid, the power distribution output port is connected to the transformer input port, and the transformer output port is connected to the IT power input port.

Optionally, the data center further comprises a standby power equipment container, wherein the standby power equipment container is provided with a generator therein, the standby power equipment container has a standby output port, and the standby power equipment container is prefabricated with a fourth cable connecting the generator and the standby output port.

The power distribution equipment container has a second power distribution input port, the second cable connects the second power distribution input port with the power distribution equipment, and the standby power output port is connected to the second power distribution input port.

Optionally, the data center further comprises a network equipment container, wherein the network equipment container is provided with a network cabinet, a column head power distribution cabinet, and a second air conditioning unit therein, the network equipment container has a network power input port, and the network equipment container is prefabricated with a fifth cable connects the column head power distribution cabinet with the network cabinet, the second air conditioning unit and the network power input port, and the network power input port is connected to the transformer output port.

Optionally, the data center further comprises an administrative and auxiliary equipment container, in which at least one of fire-fighting equipment, a weak current room, a central control room and an office is provided.

Other features and advantages of the present disclosure will be described in detail in the subsequent specific embodiments.

BRIEF DESCRIPTION OF THE DRAWINGS

The drawings are used to provide a further understanding of the disclosure and form a part of the specification. They are used to explain the disclosure together with the following specific embodiments, but do not constitute a limitation on the disclosure. In the attached figure.

DESCRIPTION OF SYMBOLS

Figure 1:
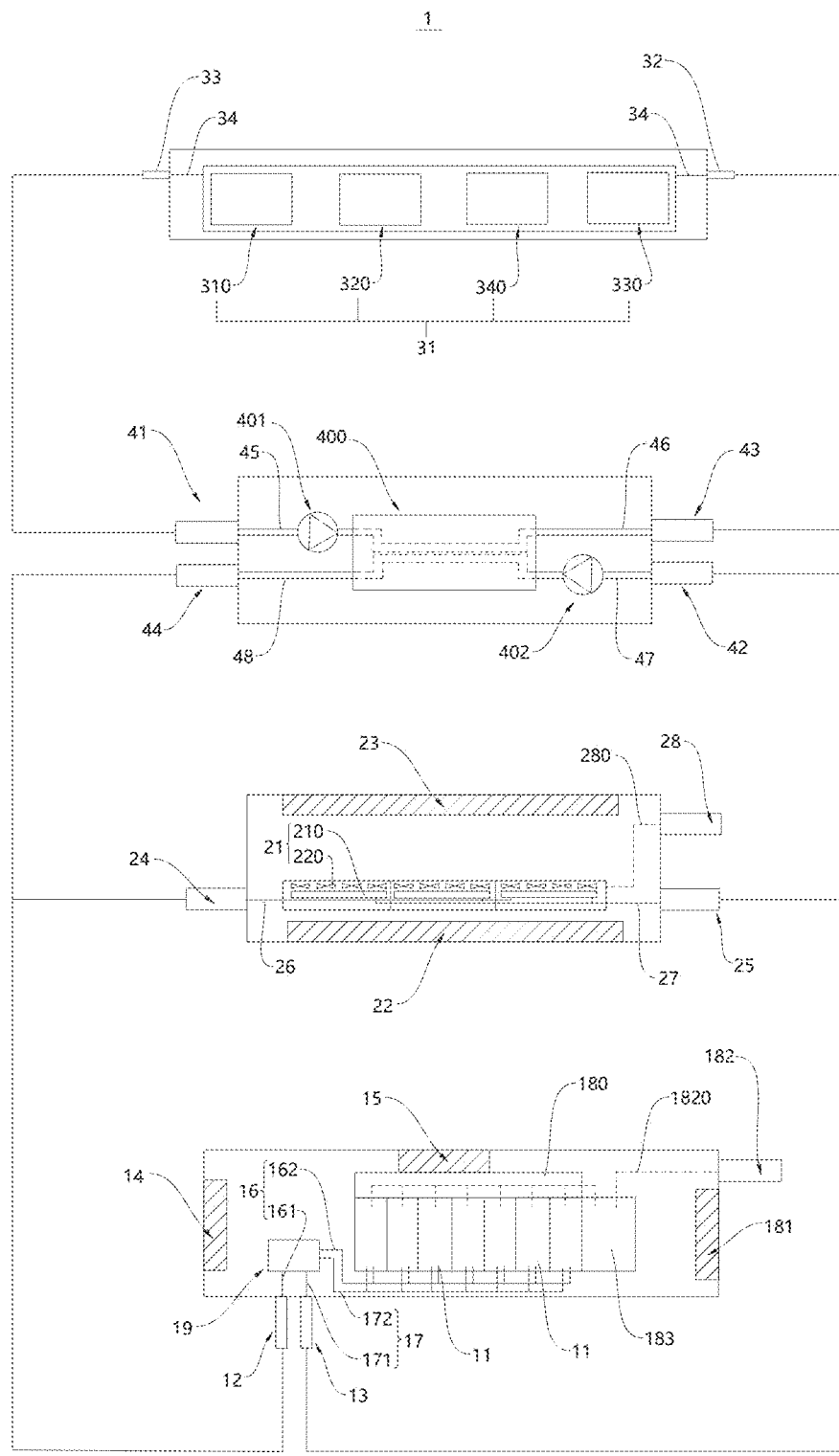
FIG. 1 is a schematic diagram of liquid cooling connection of an IT equipment container, an air-cooling equipment container, a hydraulic equipment container and a heat dissipation equipment container in the data center provided by an example embodiment of the present disclosure.
Figure 2:
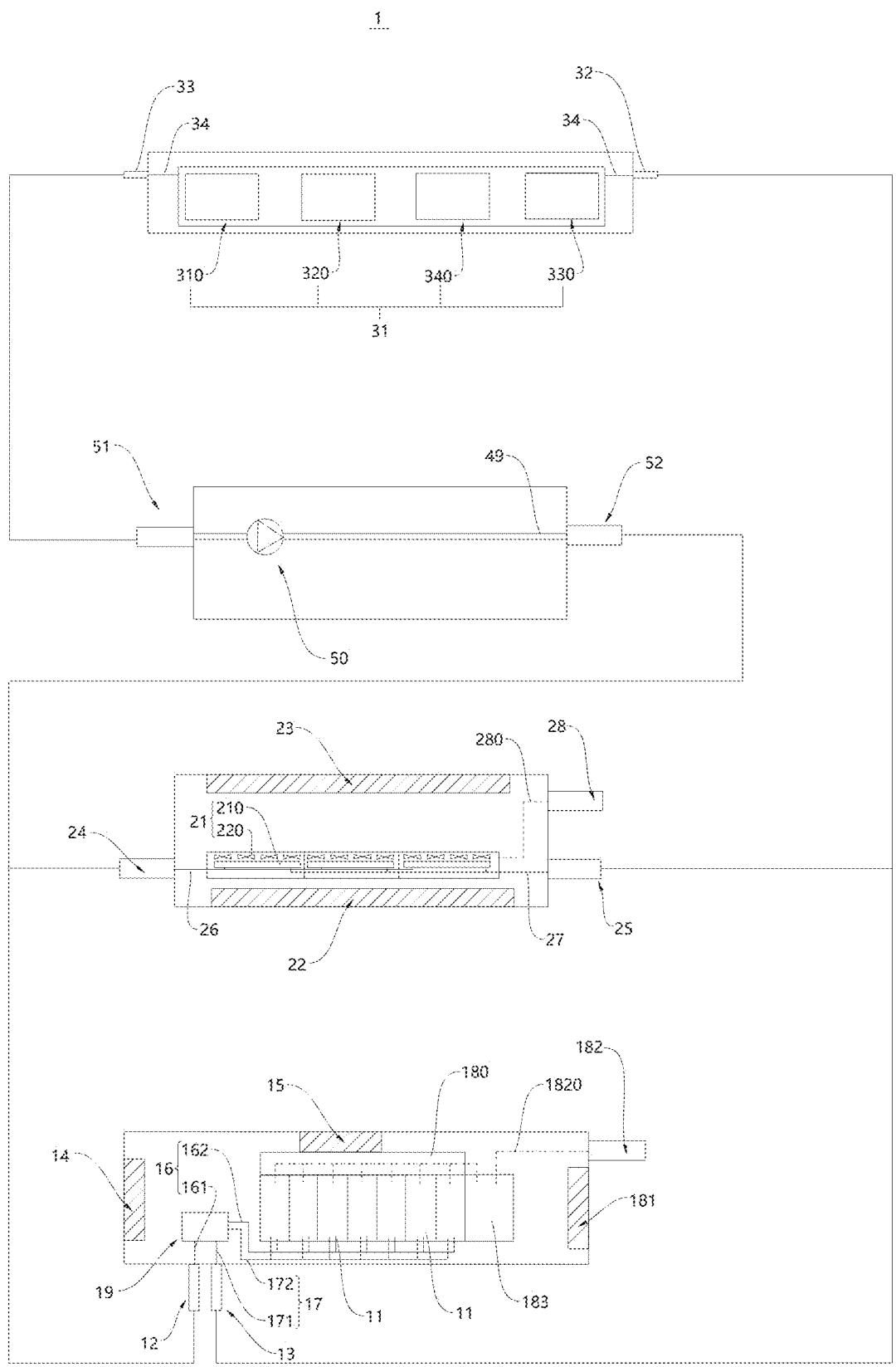
FIG. 2 is a schematic diagram of liquid cooling connection of an IT equipment container, an air-cooling equipment container, a hydraulic equipment container and a heat dissipation equipment container in the data center provided by another example embodiment of the present disclosure.
Figure 3:
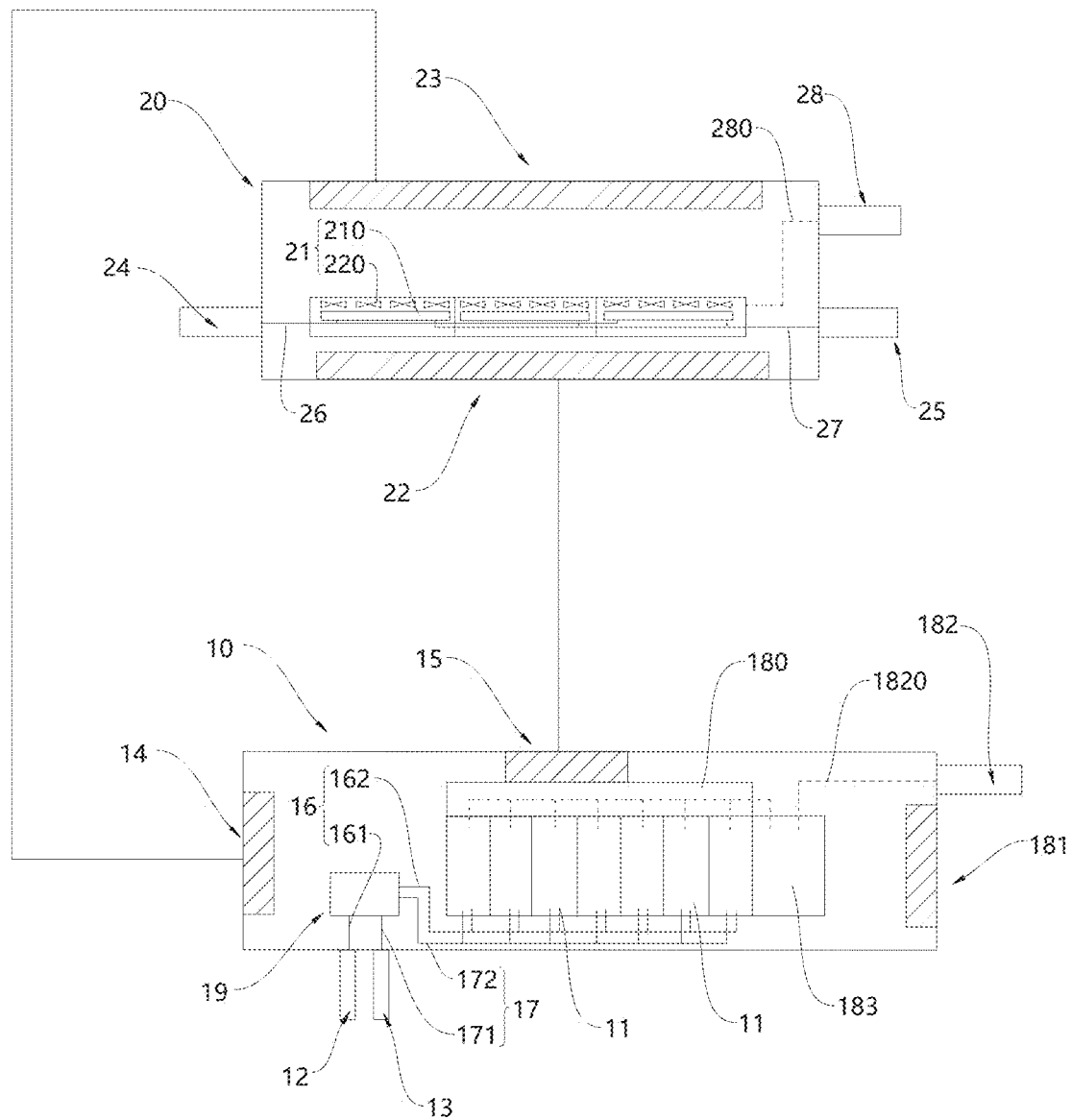
FIG. 3 is a schematic diagram of air-cooling connection between an IT equipment container and an air-cooling equipment container in the data center provided by an example embodiment of the present disclosure.

1—Data center; 10—IT equipment container; 11—server rack; 12—IT coolant inlet port; 13—IT coolant outlet port; 14—IT air inlet port; 15—IT air outlet port; 16—Coolant inlet pipe; 161—First sub coolant inlet pipe; 162—Second sub coolant inlet pipe; 17—Coolant outlet pipe; 171—First sub coolant outlet pipe; 172—Second sub coolant outlet pipe; 180—Air duct; 181—Smoke vent; 182—IT power input port; 1820—First cable; 183—Power distribution cabinet; 19—Second liquid-liquid heat exchanger; 20—Air-cooling equipment container; 21—Air-cooling equipment; 210—Air-liquid heat exchanger; 220—fan; 22—Air-cooling air inlet port; 23—Air-cooling air outlet port; 24—Air-cooling coolant inlet port; 25—Air-cooling coolant outlet port; 26—Heat exchange liquid inlet pipe; 27—Heat exchange outlet pipe; 28—Air-cooling power input port; 280—Sixth cable; 30—Heat dissipation equipment container; 300—Heat dissipation power input port; 31—Heat dissipation equipment; 310—Open cooling tower; 320—Closed cooling tower; 330—First air conditioning unit; 340—Supplementary cooling machine; 32—Heat dissipation coolant inlet port; 33—Heat dissipation coolant outlet port; 34—Heat dissipation pipe; 40—Hydraulic equipment container; 410 Hydraulic power input port; 400—First liquid-liquid heat exchanger; 401—First water pump; 402—Second water pump; 41—First hydraulic coolant inlet port; 42—Second hydraulic coolant inlet port; 43—First hydraulic coolant outlet port; 44—Second hydraulic coolant outlet port; 45—First pipe; 46—Second pipe; 47—Third pipe; 48—Fourth pipe; 49—Fifth pipe; 50—water pump; 51—Hydraulic coolant inlet port; 52—Hydraulic coolant outlet port; 60—Power distribution equipment container; 600—Power distribution equipment; 61—First power distribution input port; 62—Second power distribution input port; 63—Power distribution output port; 70—Transformer equipment container; 700—Transformer equipment; 701—Transformer input port; 702—Transformer output port; 80—Standby power equipment Container; 81—Generator; 82—Standby power output port; 90—Network equipment container; 91—Network power input port; 100—Administrative and auxiliary equipment container; 101—Fire-fighting equipment; 102 weak current room; 103—Central control room; 104—Office; 105—Administrative power input port.

DETAILED DESCRIPTION

The specific embodiments of the present disclosure are described in detail below in combination with the accompanying drawings. It should be understood that the specific implementation mode described here is only used to explain and interpret the disclosure and is not used to limit the disclosure.

In the present disclosure, without any explanation to the contrary, "connection" means that the corresponding devices can be connected directly or indirectly, "dock" means that the corresponding devices can be connected directly, and "inside" or "outside" means the inside or outside of the corresponding structure or component outline; "far" and "near" indicate the relative distance of the respective structures or components being far or near.

Referring to FIGS. 1 to 15, to achieve the above purpose, the present disclosure provides a data center 1, including an IT equipment container 10 and an air-cooling equipment container 20, wherein the IT equipment container 10 is provided with a server rack 11 therein, the IT equipment container 10 has an IT coolant inlet port 12, an IT coolant outlet port 13, an IT air inlet port 14 and an IT air outlet port 15, and the IT equipment container 10 is prefabricated with a coolant inlet pipe 16 connecting the IT coolant inlet port 12 to a coolant inlet of the server rack 11, a coolant outlet pipe 17 connecting the IT coolant outlet port 13 to a coolant outlet of the server rack 11, and an air duct 180 connecting the IT air outlet port 15 to an air outlet of the server rack 11, and the IT air inlet port 14 is connected to inside of the IT equipment container 10; an air-cooling equipment container 20 is provided with air-cooling equipment 21 therein, the air-cooling equipment container 20 has an air-cooling air inlet port 22 and an air-cooling air outlet port 23, the air-cooling air inlet port 22 is docked with the IT air outlet port 15, the air-cooling air outlet port 23 is docked with the IT air inlet port 14, and the air-cooling equipment 21 is for cooling air flowing in from the air-cooling air inlet port 22, so that a temperature of air flowing out of the air-cooling air outlet port 23 can be lower than a temperature of the air flowing in from the air-cooling air inlet port 22.

Through the above technical solution, the IT equipment container 10 and the air-cooling equipment container 20 can be prefabricated in advance at the factory prior to constructing the data center. That is, server racks 11 are integrated into the IT equipment container 10, and air-cooling equipment 21 is integrated into the air-cooling equipment container 20. During construction phase of the data center 1, the prefabricated IT equipment container 10 and air-cooling equipment container 20 can be directly transported to the designated construction site, Installation for the IT equipment container 10 and air-cooling equipment container 20 is achieved by directly connecting the air-cooling air inlet port 22 outside the air-cooling equipment container 20 to the IT air outlet port 15 outside the IT equipment container 10, connecting the air-cooling air outlet port 23 outside the air-cooling equipment container 20 to the IT air inlet port 14 outside the IT equipment container 10, and connecting the IT coolant inlet port 12 and IT coolant outlet port 13 to the corresponding coolant supply equipment, Consequently, the deployment and delivery of the data center 1 can be swiftly and efficiently executed, thereby reducing the construction period, and mitigating the associated carbon emissions caused during the construction of the data center 1.

Additionally, in the prior art, the data center's machine room is typically provided with both server racks and air-cooling equipment, such as air conditioning units, which achieve cooling by circulating air to the server racks through the cooling equipment. However, when both the server racks and air-cooling equipment occupy the same space, the installation area of the server racks is occupied by the air-cooling equipment, leading to a reduced density of server rack placements and reduced number of the server racks provided therein. Furthermore, the cooling capacity of air-cooling equipment for the server racks is limited. As the number and density of server racks increase, the air-cooling equipment becomes insufficient to effectively cool the server racks. Consequently, there might be a need to boost the power of the air-cooling equipment or increase their quantity, resulting in a higher Power Usage Effectiveness (PUE).

In the present disclosure, firstly, the air-cooling equipment 21 and the server rack 11 are respectively set in separate containers. That is, the air-cooling equipment 21 and the server rack 11 are not integrated in the same container. Therefore, the issue of the air-cooling equipment 21 encroaching upon the installation space of the server rack 11 is circumvented. This facilitates the accommodation of a larger number of server rack 11 within the IT equipment container 10, realizing the high-density layout of the server rack 11.

Secondly, since the IT equipment container 10 not only has the IT air inlet port 14 and the IT air outlet port 15, but also has IT coolant inlet port 12 and IT coolant outlet port 13. This allows for simultaneous liquid cooling and air-cooling of the server rack 11 within IT equipment container 10 during cooling and heat dissipation of the server rack 11.

Specifically, cryogenic coolant can enter the coolant inlet pipe 16 from the IT coolant inlet port 12, and enter the server rack 11 through the coolant inlet pipe 16. After heat exchange with the servers in the server rack 11, the coolant flows from the coolant outlet of the server rack 11 into the coolant outlet pipe 17, and then flows out through the IT coolant outlet port 13, thereby to dissipate heat generated by the servers outside of the IT equipment container 10. At the same time of liquid cooling the server through coolant, the air-cooling equipment 21 in the air-cooling equipment container 20 operates, and the cold air flows from the air-cooling air outlet port 23 on the air-cooling equipment container 20 to the IT equipment container 10 through the IT air inlet port 14 on the IT equipment container 10. When the cold air flows through the server rack 11, it exchanges heat with the server rack 11 and turns into hot air. The hot air enters the air duct 180 and flows back to the air-cooling equipment container through the IT air outlet port 15 and the air-cooling inlet port 22. After the hot air flowed back into the air-cooling equipment container 20 is cooled by the air-cooling equipment 21, it turns into cold air and is blown back to the server rack 11 again to cool the server. In this way, the server rack 11 can be cooled and dissipated by the above two ways of air-cooling and liquid cooling, which has higher cooling efficiency and better cooling effect. It can allow more server rack 11 to be provided in the IT equipment container 10, that is, it can allow high-density server rack 11 to be arranged in the IT equipment container 10.

Here, it should be noted that the IT coolant inlet port 12 and the IT coolant outlet port 13 of the IT equipment container 10 can be connected to any coolant supply equipment that can provide low-temperature coolant, for example, the IT coolant inlet port 12 and the IT coolant outlet port 13 can be connected to a cooling tower, an air conditioning refrigeration unit, a cold water source, etc. In short, as long as low-temperature coolant can be provided, the present disclosure does not limit this.

In addition, in order to further reduce the cooling cost of the data center 1, the coolant mentioned above can be water, which is cheap, easy to supply, and will not pollute the atmospheric environment during the heat exchange process. Of course, the above coolant can also be any other suitable coolant (such as refrigerant), which is not limited by the present disclosure.

Optionally, to facilitate the docking (that is, direct connection) of the IT air inlet port 14, the IT air outlet port 15 with the air-cooling air inlet port 22, air-cooling air outlet port 23, so as to improve construction speed of the data center 1, the IT air inlet port 14, the IT air outlet port 15 can be provided on the same side of the IT equipment container 10. The air-cooling air inlet port 22 and the air-cooling air outlet port 23 can also be provided on the same side of the air-cooling equipment container 20, so as to facilitate docking of the IT air inlet port 14, the IT air outlet port 15 with air-cooling air inlet port 22 and air-cooling air outlet port 23.

The above air-cooling equipment 21 can be any suitable air-cooling equipment that can provide cold air, for example, an air conditioning cooling unit. For embodiments where the air-cooling equipment is an air conditioning cooling unit, the air flow from the air-cooling inlet port 22 can flow through an evaporator in the air conditioning cooling unit and then flow out of the air-cooling outlet port 23. The low-temperature refrigerant in the evaporator can absorb the heat of the air flowing in from the air-cooling inlet port 22 and reduce the air temperature.

In another embodiment provided by the present disclosure, as shown in FIGS. 1 to 4 and 7, optionally, the air-cooling equipment 21 may comprise an air-liquid heat exchanger 210 and a fan 220. The air-cooling equipment container 20 has an air-cooling coolant inlet port 24 and an air-cooling coolant outlet port 25. The air-cooling equipment container 20 is prefabricated with a heat exchange inlet pipe 26 connecting the air-cooling coolant inlet port 24 and a coolant inlet of the air-liquid heat exchanger 210, and a heat exchange outlet pipe 27 connecting the air-cooling coolant outlet port 25 and a coolant outlet of the air-liquid heat exchanger 210. The fan 220 is used to causing the air flowing in from the air-cooling inlet port 22 to pass through the air-liquid heat exchanger 210 and flows out from the air-cooling outlet port 23. During the cooling of the server rack 11, the cooler coolant flows into the air-liquid heat exchanger 210. When the fan 220 is running, the hot air flowing out of the IT equipment container 10 enters the air-cooling equipment container 20 through the air-cooling air inlet port 22, and is blown to the air-liquid heat exchanger 210 by the fan 220. The hot air exchanges heat with the coolant in the air-liquid heat exchanger 210, so that the temperature of the hot air that absorbs heat in the IT equipment container 10 decreases, and the air that turns into low-temperature air is blown from the air-cooling air outlet port 23 to the server rack 11 in the IT equipment container 10 again to continue cooling the server and realize air-cooling of the server. The low-temperature coolant after absorbing the heat of the server turns into high temperature coolant, and flows out from the air-cooling coolant outlet port 25 of the air-cooling equipment container 20 to realize the continuous cooling of the server.

Since the air-liquid heat exchanger 210, the fan 220, the heat exchange inlet pipe 26 and the heat exchange outlet pipe 27 have been integrated into the air-cooling equipment container 20 in the factory, during construction of the data center 1, there is no need to assemble the air-liquid heat exchanger 210, the fan 220, the heat exchange inlet pipe 26 and the heat exchange outlet pipe 27 at the construction site, only the air-cooling coolant inlet port 24 and air-cooling coolant outlet port 25 need to be connected to the coolant supply equipment (such as the cooling tower) used to supply coolant to the air-liquid heat exchanger 210, so that flexible and rapid deployment of the data center 1 can be achieved.

Here, the present disclosure does not limit the coolant supply equipment connected to the air-cooling coolant inlet port 24 and the air-cooling coolant outlet port 25, as long as it can provide low-temperature coolant to the air-liquid heat exchanger 210.

Figure 8:
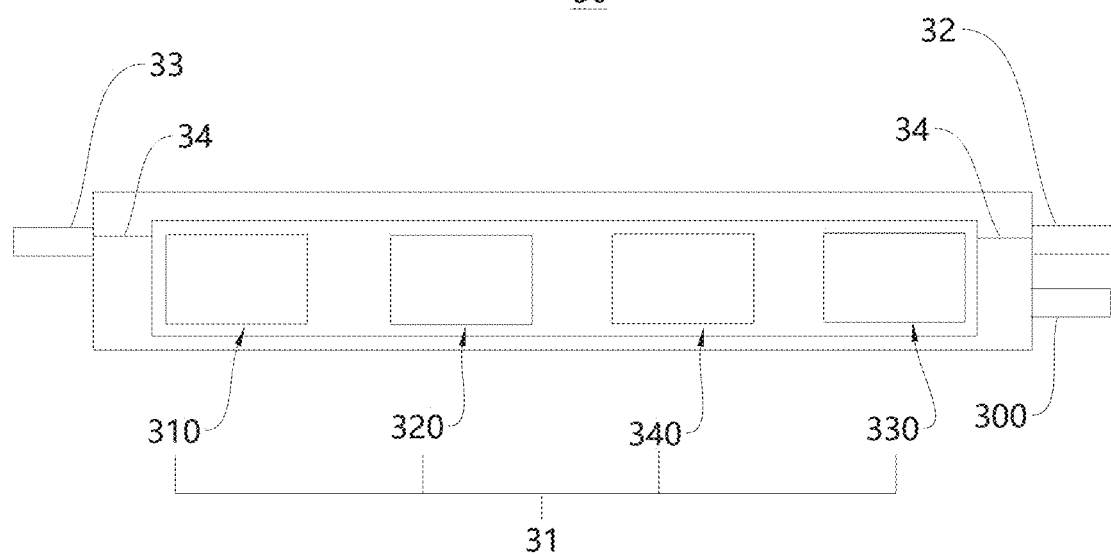
FIG. 8 is a plan diagram of a heat dissipation equipment container in a data center provided by an example embodiment of the present disclosure.

Optionally, to provide cryogenic coolant to the air-liquid heat exchanger 210 and the server rack 11, and further improve construction speed of the data center 1 on this basis, as shown in FIG. 8, the data center 1 may also comprise a cooling equipment container 30, in which cooling equipment 31 is provided. The cooling equipment container 30 has a heat dissipation coolant inlet port 32 and a heat dissipation coolant outlet port 33. The cooling equipment container 30 is prefabricated with a cooling pipe 34 connecting the cooling equipment 31 to the heat dissipation coolant inlet port 32 and the heat dissipation coolant outlet port 33. The heat dissipation coolant inlet port 32 is connected to the IT coolant outlet port 13 and the air-cooling coolant outlet port 25, the heat dissipation coolant outlet port 33 is connected to the IT coolant inlet port 12 and the air-cooling coolant inlet port 24, and the heat dissipation equipment 31 is used to cause a temperature of the coolant flowing out of the heat dissipation coolant outlet port 33 to be lower than a temperature of the coolant flowing in from the heat dissipation coolant inlet port 32.

In this way, the high-temperature coolant flowing through the server rack 11 and the high-temperature coolant flowing out of the air-liquid heat exchanger 210 enter the cooling equipment 31 through the heat dissipation coolant inlet port 32 of the cooling equipment container 30. After the cooling equipment 31 dissipates the heat of the high-temperature coolant into the low-temperature coolant, a part of the low-temperature coolant flows back into the server rack 11 from the heat dissipation coolant outlet port 33 through the IT coolant inlet port 12, and the other part of the low-temperature coolant flows back into the air-liquid heat exchanger 210 from the heat dissipation coolant outlet port 33 through the air-cooling coolant inlet port 24, realizing the uninterrupted cooling and heat dissipation of the server rack 11.

Since the heat dissipation equipment 31 is also integrated into the heat dissipation equipment container 30 in the factory manufacturing phase, when constructing the data center 1, the heat dissipation equipment container 30 can be directly transported to the designated construction site, and the heat dissipation equipment container 30 can be directly connected to the IT equipment container 10 and the air-cooling equipment container 20, so that the rapid deployment and delivery of the data center 1 can be achieved, the construction cycle can be shortened, and the related carbon emissions caused during the construction of the data center 1 can be reduced.

The heat dissipation equipment 31 may be any device that can reduce the temperature of the coolant and provide low-temperature coolant for the server rack 11 and the air-liquid heat exchanger 210. For example, the heat dissipation equipment 31 may comprise a cooling tower and/or the first air conditioning unit 330.

For embodiments of the heat dissipation equipment 31 including a cooling tower, the cooling tower may be an open cooling tower 310, a closed cooling tower 320, a natural draft cooling tower, a mechanical draft cooling tower, a mixed draft cooling tower, a wet cooling tower, a dry cooling tower, a dry wet cooling tower, etc. The specific type, quantity, size, shape, etc. of the cooling tower are not limited in the present disclosure. Since the cooling tower is an apparatus that discharges absorbed heat into the atmosphere to reduce the temperature of the coolant, its cooling principle is to reduce the water temperature by making use of the principle of cold and heat exchange to generate steam after the coolant contacts the air flow, and the steam volatilization takes away heat to achieve evaporative heat dissipation, convective heat transfer, radiation heat transfer and other principles. Therefore, for the condition that the cooling tower provides low-temperature coolant to the server rack 11 and the air-liquid heat exchanger 210, the setting of the cooling tower can help reduce the total energy consumption of the data center, thereby reducing the PUE of the data center, and thus reducing carbon emissions. Moreover, since the cooling temperature of the cooling tower is related to the wet bulb temperature of the environment in which the cooling tower is located, rather than the dry bulb temperature (i.e. the ambient temperature) of the environment in which the cooling tower is located, and the wet bulb temperature in most regions of the world can meet the demand for the temperature of the coolant flowing out of the cooling tower's coolant outlet, the cooling system of the data center provided by the present disclosure can be applied to most regions of the world without being easily restricted by the regional ambient temperature.

For embodiments of the heat dissipation equipment 31 including the first air conditioning unit 330, the first air conditioning unit 330 can comprise a compressor, a condenser, an expansion valve and a heat exchanger which are connected in series to form a circuit in turn. The coolant inlet and outlet of the heat exchanger are respectively connected to the heat dissipation coolant inlet port 32 and the heat dissipation coolant outlet port 33. In this way, the low-temperature refrigerant after throttling and depressurizing by the expansion valve can flow into the heat exchanger to exchange heat with the coolant in the heat exchanger to absorb the heat of the coolant, so that the coolant with reduced temperature flows out of the heat dissipation coolant outlet port 33 and flows to the server rack 11 and the air-liquid heat exchanger 210.

For embodiments where the heat dissipation equipment 31 comprises a cooling tower and/or the first air conditioning unit 330, it can be understood that according to the current temperature or cooling demand of the server rack 11, the cooling capacity of the coolant flowing to the server rack 11 and the air-liquid heat exchanger 210 can be provided by the cooling tower, or by the first air conditioning unit 330, or by the cooling tower and the first air conditioning unit 330 together.

Figure 9:
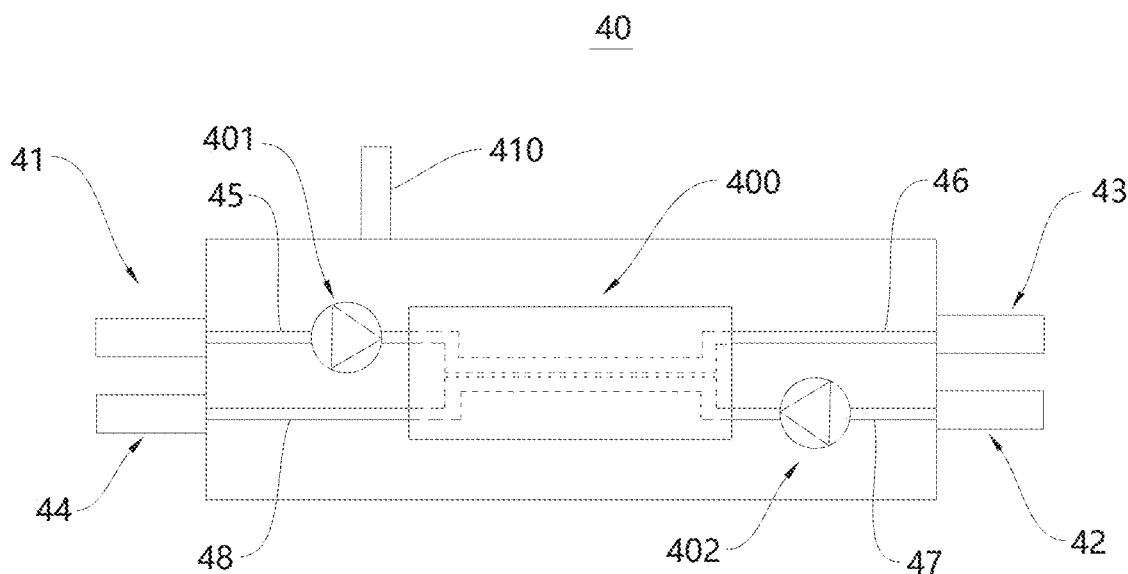
FIG. 9 is a plan diagram of a hydraulic equipment container in a data center provided by an example embodiment of the present disclosure.

For embodiments where the cooling tower is an open cooling tower 310, optionally, the data center 1 may also comprise a hydraulic equipment container 40, as shown in FIG. 9, the hydraulic equipment container 40 is provided with a first liquid-liquid heat exchanger 400, a first water pump 401, and a second water pump 402 therein. The hydraulic equipment container 40 has a first hydraulic coolant inlet port 41, a second hydraulic coolant inlet port 42, a first hydraulic coolant outlet port 43 and a second hydraulic coolant outlet port 44. The hydraulic equipment container 40 is are prefabricated with a first pipe 45 connecting the first coolant inlet of the first liquid-liquid heat exchanger 400 to the first hydraulic coolant inlet port 41, a second pipe 46 connecting the first coolant outlet of the first liquid-liquid heat exchanger 400 to the first hydraulic coolant outlet port 43, a third pipe 47 connecting the second coolant inlet of the first liquid-liquid heat exchanger 400 to the second hydraulic coolant inlet port 42, and a fourth pipe 48 connecting the second coolant outlet of the first liquid-liquid heat exchanger 400 to the second hydraulic coolant outlet port 44. The first hydraulic coolant inlet port 41 is connected to the heat dissipation coolant outlet port 33, and the first hydraulic coolant outlet port 43 is connected to the heat dissipation coolant inlet port 32, the second hydraulic coolant inlet port 42 is docked with the IT coolant outlet port 13 and the air-cooling coolant outlet port 25, the second hydraulic coolant outlet port 44 is docked with the IT coolant inlet port 12 and the air-cooling coolant inlet port 24. The first water pump 401 is arranged on the first pipe 45 and/or the second pipe 46; the second water pump 402 is arranged on the third pipe 47 and/or the fourth pipe 48.

Since the coolant of the open cooling tower 310 will be exposed to the external environment during operation, which will affect the cleanliness of the coolant, in order to prevent the coolant with lower cleanliness from entering the server rack 11, the first liquid-liquid heat exchanger 400 is provided in the hydraulic equipment container 40 above. In this way, if the cooling tower is an open cooling tower 310, the low-temperature coolant flows into the first liquid-liquid heat exchanger 400 from the heat dissipation coolant outlet port 33 through the first hydraulic coolant inlet port 41, and returns to the open cooling tower 310 from the first coolant outlet of the first liquid-liquid heat exchanger 400 through the heat dissipation coolant inlet port 32. At the same time, the high-temperature coolant flows out from the coolant outlet of the server rack 11 and the coolant outlet of the air-liquid heat exchanger 210, and flows into the first liquid-liquid heat exchanger 400 from the IT coolant outlet port 13 and the air-cooling coolant outlet port 25 through the second hydraulic coolant inlet port 42, respectively. After the high-temperature coolant flowing into the first liquid-liquid heat exchanger 400 exchanges heat with the low-temperature coolant in the first liquid-liquid heat exchanger 400, it flows, from the second hydraulic coolant outlet port 44, into the IT equipment container 10 through the IT coolant inlet port 12 and into the air-cooling equipment container 20 through the air-cooling coolant inlet port 24, respectively. While after the low-temperature coolant flowing out of the open cooling tower 310 exchanges heat with the high-temperature coolant, it turns into the high-temperature coolant and flows back to the open cooling tower 310 through the heat dissipation coolant inlet port 32, and discharges the heat to the atmosphere. That is to say, by setting the first liquid-liquid heat exchanger 400, it is possible to prevent the coolant with lower cleanliness flowing out of the open cooling tower 310 from directly entering the server rack 11 and the air-liquid heat exchanger 210, so as to avoid affecting the server rack 11 and the air-liquid heat exchanger 210.

In the above cycle heat exchange process, the first water pump 401 can provide driving force for the flow of coolant between the open cooling tower 310 and the first liquid-liquid heat exchanger 400, so that the coolant can circulate between the first liquid-liquid heat exchanger 400 and the open cooling tower 310. The second water pump 402 can provide driving force for the flow of coolant between the first liquid-liquid heat exchanger 400 and the server rack 11 and the air-liquid heat exchanger 210, so that the coolant can circulate between the first liquid-liquid heat exchanger 400, the server rack 11 and the air-liquid heat exchanger 210.

Here, the rotational speeds of the first water pump 401 and the second water pump 402 can be adjusted to match the cooling and heat dissipation requirements of the server rack 11. Specifically, when the heat dissipation requirements of the server rack 11 increase, the rotational speeds of the first water pump 401 and the second water pump 402 can be correspondingly increased. In this way, a larger amount of coolant can be exchanged with the server rack 11 per unit time to improve the heat exchange efficiency with the server rack 11. When the heat dissipation requirements of the server rack 11 decrease, the rotational speeds of the first water pump 401 and the second water pump 402 can be correspondingly reduced, which can meet the heat dissipation requirements of the server rack 11, and reduce the energy consumption of the first water pump 401 and the second water pump 402. The number of the first water pump 401, the second water pump 402 and the first liquid-liquid heat exchanger 400 can be one or more, and the present disclosure does not specifically limit this.

In addition, when the second hydraulic coolant inlet port 42 is docked with the IT coolant outlet port 13 and the air-cooling coolant outlet port 25, and the second hydraulic coolant outlet port 44 is docked with the IT coolant inlet port 12 and the air-cooling coolant inlet port 24, the second hydraulic coolant inlet port 42 and the second hydraulic coolant outlet port 44 may be three-way connections, so that the second hydraulic coolant inlet port 42 can be directly docked with the IT coolant outlet port 13 and the air-cooling coolant outlet port 25, and the second hydraulic coolant outlet port 44 can be directly docked with the IT coolant inlet port 12 and the air-cooling coolant inlet port 24.

Figure 10:
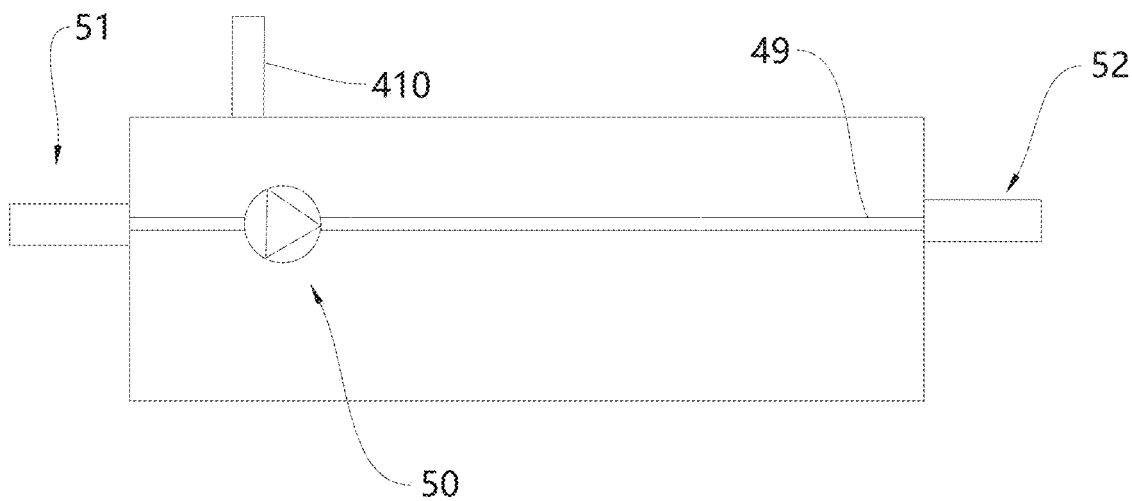
FIG. 10 is a plan diagram of a hydraulic equipment container in a data center provided by another example embodiment of the present disclosure.
Figure 11:
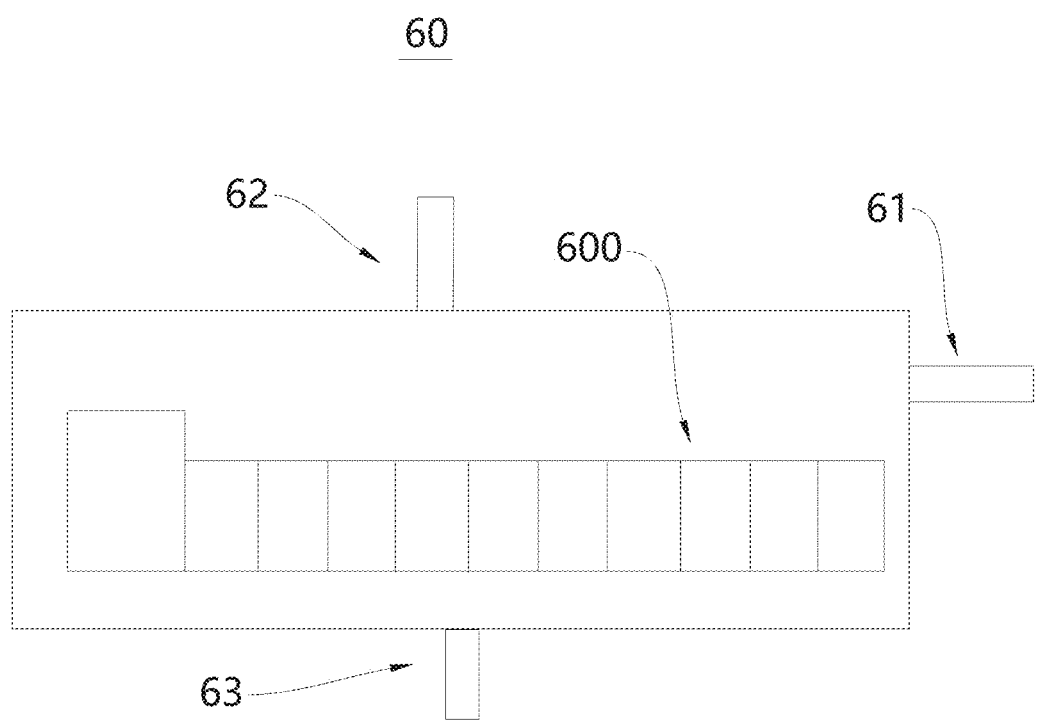
FIG. 11 is a plan diagram of a power distribution equipment container in a data center provided by an example embodiment of the present disclosure.
Figure 12:
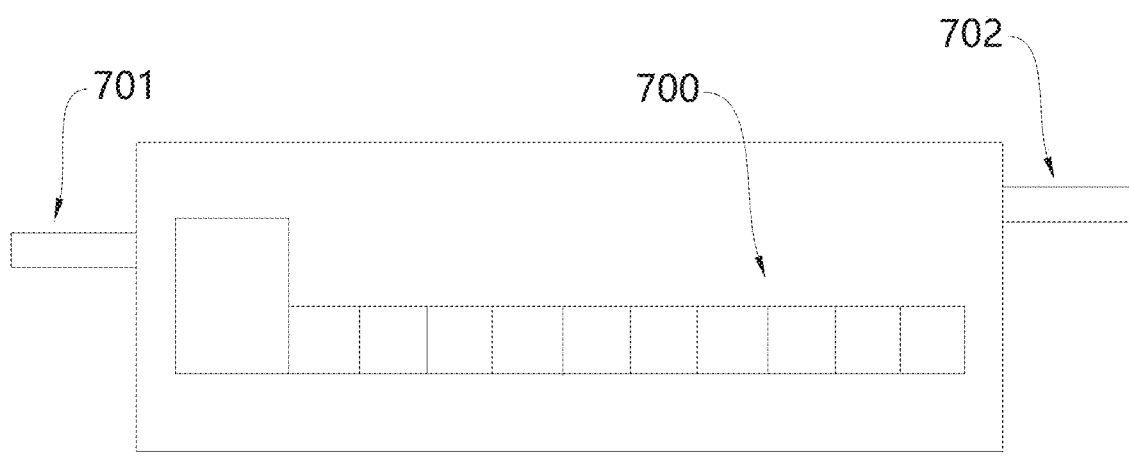
FIG. 12 is a plan diagram of a transformer equipment container in a data center provided by an example embodiment of the present disclosure.

For embodiments where the cooling tower is a closed cooling tower 320, optionally, as shown in FIG. 10, the data center 1 may also comprise a hydraulic equipment container 40, which is provided with a water pump 50. The hydraulic equipment container 40 has a hydraulic coolant inlet port 51 and a hydraulic coolant outlet port 52. The hydraulic equipment container 40 is prefabricated with a fifth pipeline 49 connecting the water pump 50 to the water coolant inlet port 51 and the water coolant outlet port 52. The hydraulic coolant inlet port 51 is connected to the heat dissipation coolant outlet port 33, and the hydraulic coolant outlet port 52 is docked with the IT coolant inlet port 12 and the air-cooling coolant inlet port 24. In this way, during the cooling of the server rack 11, the water pump 50 can provide driving force for the coolant, so that the coolant flowing from the hydraulic coolant outlet port 52 can flow to the IT coolant inlet port 12 and the air-cooling coolant inlet port 24. As the closed cooling tower 320 is fully enclosed during the process of cooling coolant, the coolant is not easy to be contaminated by sundries, and the cleanliness of the coolant is high. The coolant from the closed cooling tower 320 can directly flow into the server rack 11 and the air-liquid heat exchanger 210.

In the above embodiment with the hydraulic equipment container 40, the water pump 50 or the first liquid-liquid heat exchanger 400 is integrated into the hydraulic equipment container 40 in advance in the factory. When constructing the data center 1, it is only necessary to connect the hydraulic equipment container 40 with the IT equipment container 10, the air-cooling equipment container 20, and the heat dissipation equipment container 30.

In addition, optionally, the IT equipment container 10 may also be provided with a cooling capacity distribution unit, as shown in FIG. 1, FIG. 2, FIG. 3 and FIG. 6. The cooling capacity distribution unit comprises a second liquid-liquid heat exchanger 19, the coolant inlet pipe 16 comprises a first sub coolant inlet pipe 161 and a second sub coolant inlet pipe 162, and the coolant outlet pipe 17 comprises a first sub coolant outlet pipe 171 and a second sub coolant outlet pipe 172. The first sub coolant inlet pipe 161 connects the IT coolant inlet port 12 to the first coolant inlet of the second liquid-liquid heat exchanger 19. The second sub coolant inlet pipe 162 connects the first coolant outlet of the second liquid-liquid heat exchanger 19 to the coolant inlet of the server rack 11. The first sub coolant outlet pipe 171 connects the IT coolant outlet port 13 to the second coolant outlet of the second liquid-liquid heat exchanger 19. The second sub coolant outlet pipe 172 connects the second coolant inlet of the second liquid-liquid heat exchanger 19 to the coolant outlet of the server rack 11.

By providing the second liquid-liquid heat exchanger 19, the coolant flowing out of the heat dissipation equipment 31 will not directly flow into the interior of the server rack 11, so it will not pollute the operating environment of the server rack 11 to ensure the operating environment of the server rack 11.

In addition, since the server rack 11 has high requirements for the cleanliness of the coolant, optionally, the cooling capacity distribution unit may also comprise at least one of a filtering device, a sterilization device, and a descaling device. The filtering device, the sterilization device, or the descaling device can be arranged on the second sub coolant inlet pipe 162. By providing a filtering device, a sterilization device, or a descaling device at the second sub coolant inlet pipe 162, the cleanness of the coolant circulating in the server rack 11 can be improved, the blockage and unsmooth flow of the coolant in the pipe can be avoided or reduced, and the heat dissipation efficiency and effect of the server rack 11 can be further improved.

Figure 6:
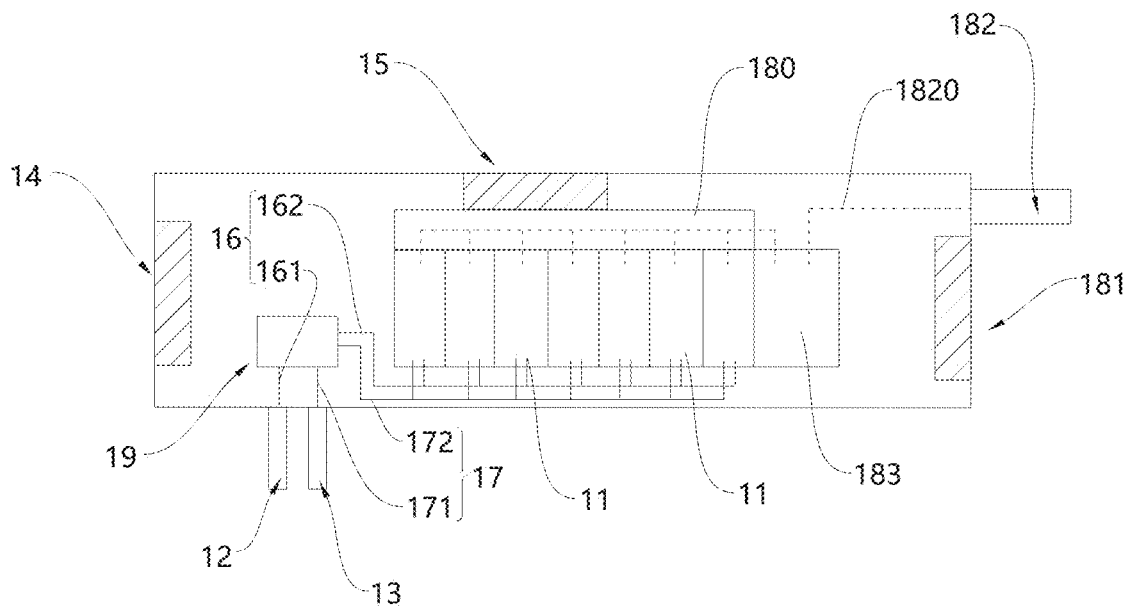
FIG. 6 is a plan diagram of the IT equipment container in a data center provided by an example embodiment of the present disclosure.
Figure 7:
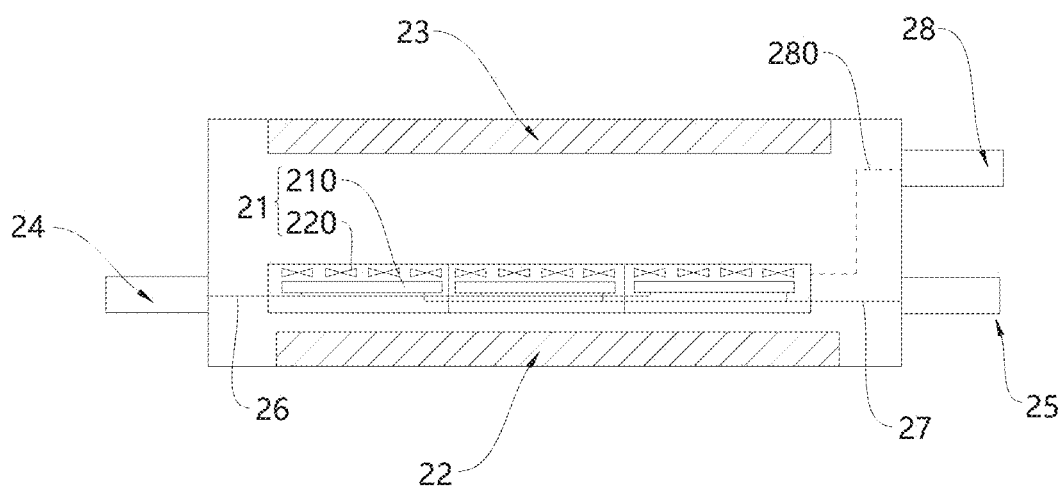
FIG. 7 is a plan diagram of an air-cooling equipment container in a data center provided by an example embodiment of the present disclosure.

Optionally, as shown in FIG. 6, the server rack 11 may be multiple in number, and multiple server racks 11 can be connected in parallel with each other, so that the coolant flowing out of the second sub coolant inlet pipe 162 can be divided into multiple strands and flow to different server racks 11.

In addition, in the case of multiple server racks 11, the air outlet of one server rack 11 can be set opposite to the air outlet of the other server rack 11, and the air outlets of the two server racks 11 are located between the air inlets of the two server racks 11, so as to facilitate the layout of the air duct 180 connected to the air outlets of the server racks 11.

Optionally, as shown in FIG. 6, the IT equipment container 10 may also have a smoke vent 181. By providing smoke vent 181, in case of fire, the smoke vent 181 can exhaust smoke and heat generated in IT equipment container 10 to the outside through the smoke vent 181, and can form negative pressure in the fire area to prevent smoke from spreading to other areas.

In addition, to supply power to server racks 11 and other equipment, a distribution equipment container 60 and a transformer equipment container 70 can be prefabricated in advance in the factory.

As an implementation, the IT equipment container 10 is also provided with a power distribution cabinet 183 therein. The IT equipment container 10 has an IT power input port 182, and the IT equipment container 10 is prefabricated with a first cable 1820 connecting the IT power input port 182 to the power distribution cabinet 183. The data center 1 further comprises a power distribution equipment container 60 and a transformer equipment container 70. The power distribution equipment container 60 is provided with a power distribution equipment 600 therein. The power distribution equipment container 60 has a first power distribution input port 61 and a power distribution output port 63. The power distribution equipment container 60 is prefabricated with a second cable connecting the power distribution equipment 600 to the first power distribution input port 61 and the power distribution output port 63. The transformer equipment container 70 is provided with a transformer equipment 700. The transformer equipment container 70 has a transformer input port 701 and a transformer output port 702. The transformer equipment container 70 is prefabricated with a third cable connecting the transformer equipment 700 to the transformer input port 701 and the transformer output port 702. The first distribution input port 61 is used to be connected to a municipal power grid. The distribution output port 63 is connected to the transformation input port 701, and the transformation output port 702 is connected to the IT power input port 182. The municipal power grid is connected to the first power distribution input port 61 on the power distribution equipment container 60. The current can be introduced to the power distribution equipment 600 through the second cable and exported from the power distribution output port 63 through the second cable. The power distribution output port 63 is connected to the transformer input port 701.

In this way, current provided by the municipal power grid can enter the transformer equipment 700 after being distributed by the power distribution equipment 600, and then enter the IT equipment container 10 through the transformer output port 702 and IT power input port 182 after voltage reduction by the transformer equipment 700, so as to realize the power supply to the server rack 11.

Since the power distribution equipment 600 and the transformer equipment 700 have been prefabricated into the power distribution equipment container 60 and the transformer equipment container 70 in the factory in advance, when constructing the data center 1, only the electrical connection relationship between the power distribution equipment container 60, the transformer equipment container 70 and the equipment requiring power supply (such as the IT equipment container 10) needs to be established to complete the power supply layout, greatly reducing construction time of the data center 1.

It can be understood that in the case of multiple IT equipment containers 10, a plurality of transformer output ports 702 can be formed on the transformer equipment container 70, and each IT equipment container 10 can be connected to the corresponding transformer output port 702.

Optionally, the power distribution equipment 600 may comprise a medium voltage power distribution cabinet, and the transformer equipment 700 may comprise a transformer, an UPS, a battery, a power distribution cabinet, etc.

Figure 4:
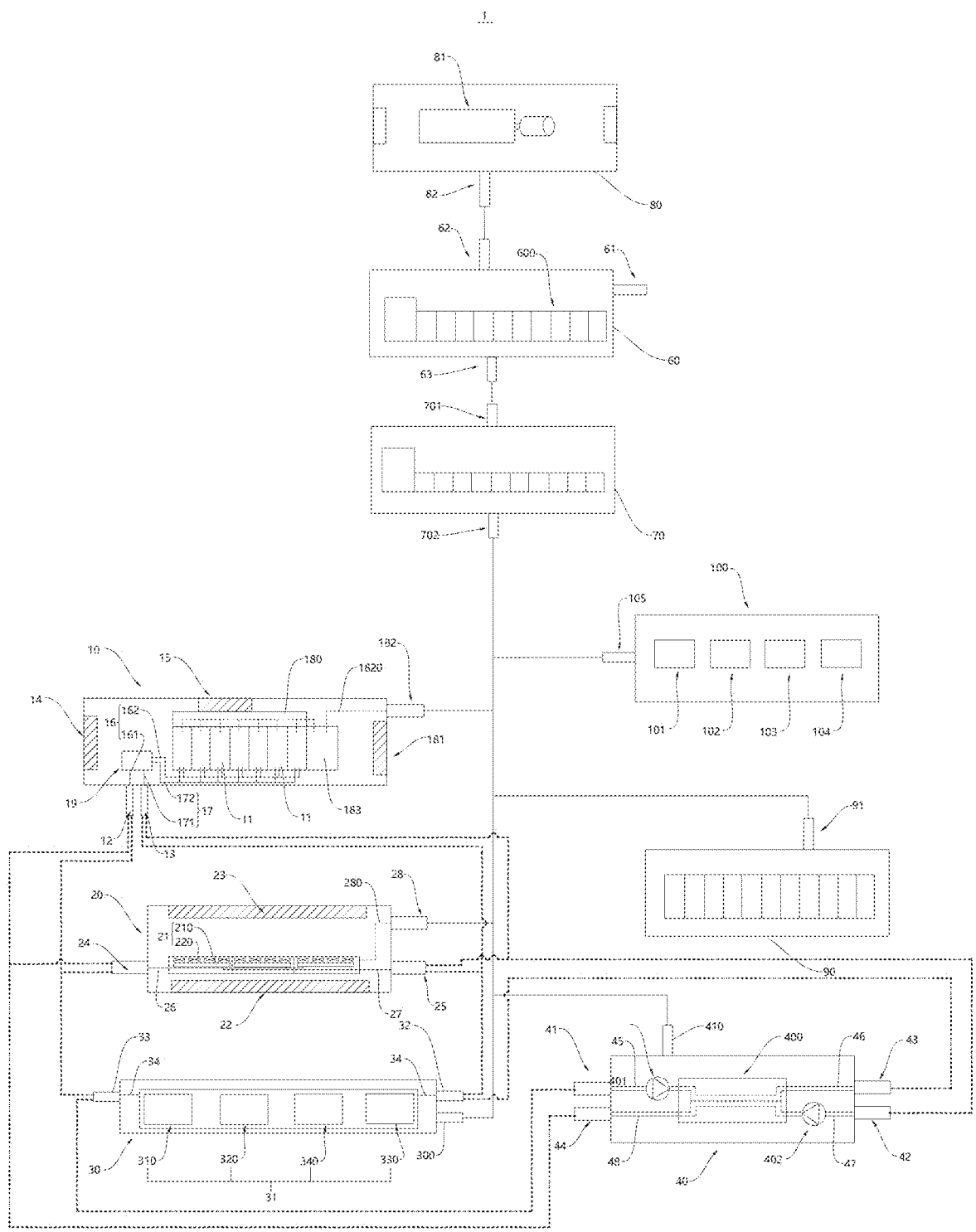
FIG. 4 is a schematic diagram of circuit connection of an IT equipment container, an air-cooling equipment container, a hydraulic equipment container, a heat dissipation equipment container, a power distribution equipment container, a transformer equipment container, a standby power equipment container, a network equipment container, an administrative and auxiliary equipment container of a data center provided by an example embodiment of the disclosure.
Figure 13:
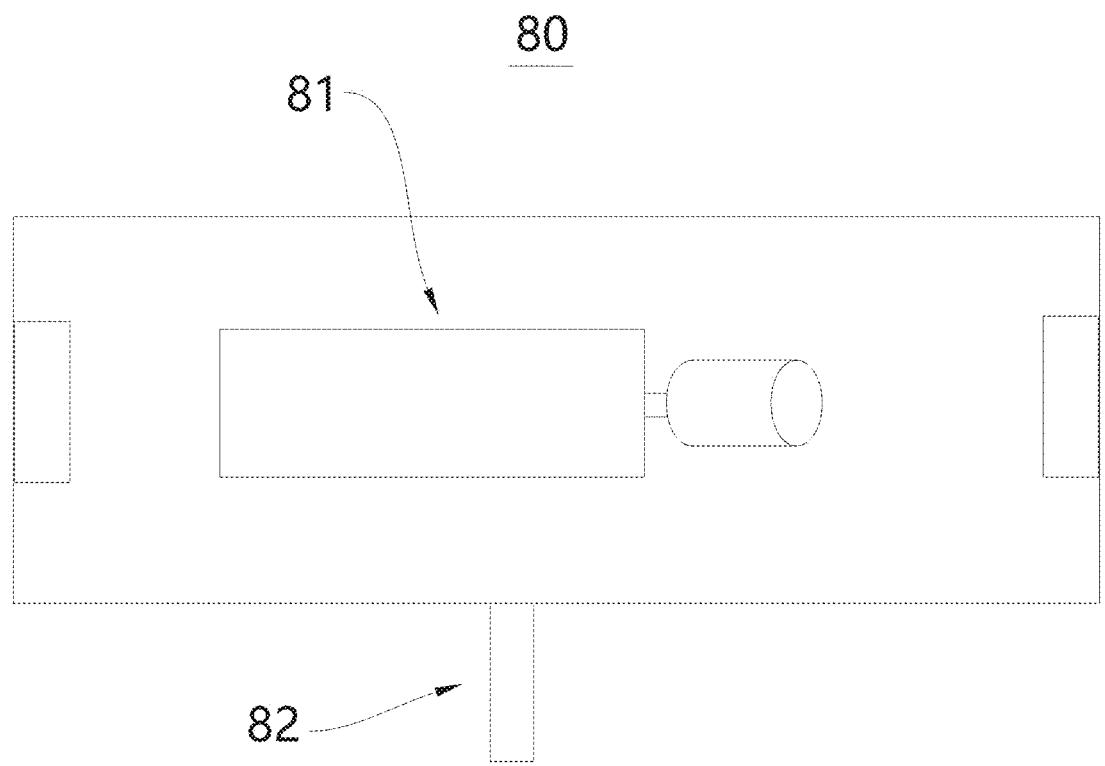
FIG. 13 is a plan diagram of the standby power equipment container in the data center provided by an example embodiment of the present disclosure.

In addition, to ensure that the data center 1 can still operate normally when the municipal power grid is cut off, the data center 1 can optionally comprise a standby power equipment container 80, as shown in FIGS. 4 and 13. The standby power equipment container 80 is equipped with a generator 81 therein. The standby power equipment container 80 has a standby output port 82, and the standby power equipment container 80 is prefabricated with a fourth cable connecting the generator 81 to the standby output port 82. The power distribution equipment container 60 has a second power distribution input port 62, the second cable connects the second power distribution input port 62 to the power distribution equipment 600, and the standby power output port 82 is connected to the second power distribution input port 62. When the municipal power grid is cut off, the standby power equipment container 80 can be used to supply power to each electrical equipment in the data center 1. Specifically, the generator 81 in the standby power equipment container 80 generates power and transmits the generated current to the standby output port 82 through the fourth cable. Since the second distribution input port 62 is connected to the standby output port 82, the power generated by the generator 81 can be transmitted to the power distribution equipment 600 through the second cable, and then output to each electrical equipment (for example, the IT equipment container 10) through the transformer equipment 700.

Figure 14:
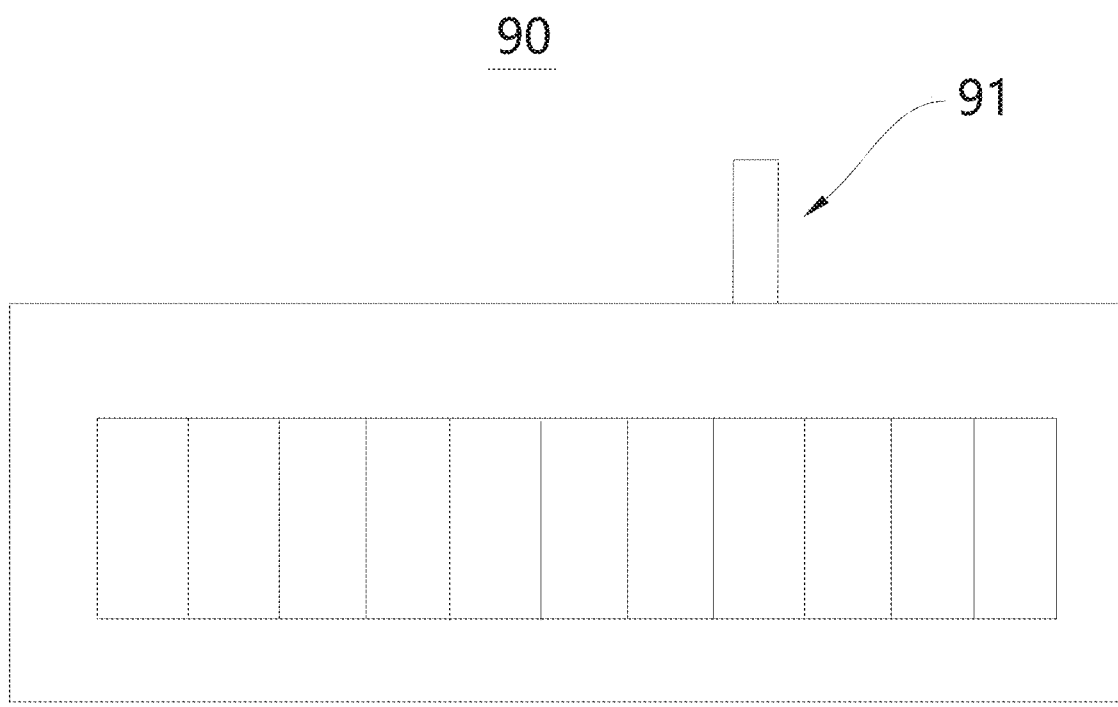
FIG. 14 is a plan diagram of a network equipment container in a data center provided by an example embodiment of the present disclosure.

Optionally, as shown in FIG. 4 and FIG. 14, the data center 1 may also comprise a network equipment container 90, in which a network cabinet therein, a column head power distribution cabinet, a second air conditioning unit are provided. The network equipment container 90 has a network power input port 91, and the network equipment container 90 is prefabricated with a fifth cable connecting the column head distribution cabinet to the network cabinet, the second air conditioning unit and the network power input port 91. The network power input port 91 is connected to the transformer output port 702. Thus, it is possible to supply power to the network cabinet, the column head distribution cabinet, the second air conditioning unit and other electric devices in the network equipment container 90.

In addition, as shown in FIG. 4, a heat dissipation power input port 300 can be provided on the heat dissipation equipment container 30, and connected to the transformer output port 702 to provide power for the cooling tower. The hydraulic equipment container 40 can be provided with a hydraulic power input port 410, which is connected to the transformer output port 702 to provide power for the first pump 401 and the second pump 402. An air-cooling power input port 28 can be provided on the air-cooling equipment container 20, and connected to the transformer output port 702 to provide power for the fan 220 in the air-cooling equipment container 20.

Figure 15:
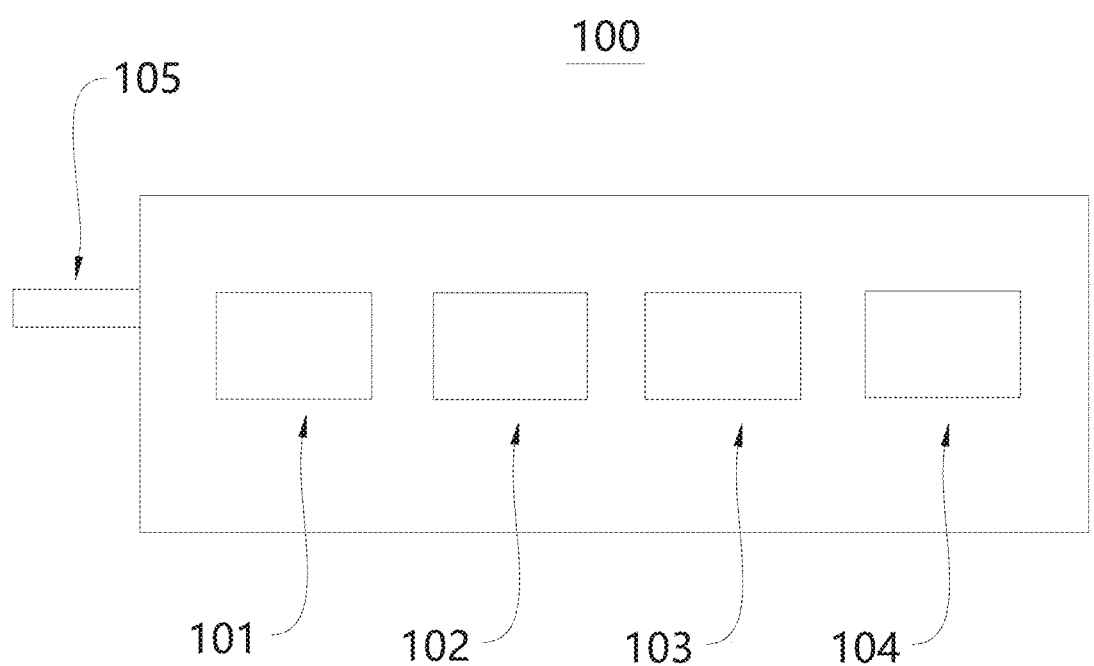
FIG. 15 is a plan diagram of an administrative and auxiliary equipment container in a data center provided by an example embodiment of the present disclosure.

Optionally, as shown in FIG. 4 and FIG. 15, the data center 1 further comprises an administrative and auxiliary equipment container 100, in which at least one of firefighting equipment 101, a weak current room 102, a central control room 103 and an office 104 is provided. Similarly, an administrative power input port 105 is also provided on the administrative and auxiliary equipment container 100. The administrative power input port 105 can be connected to the transformer output port 702 to realize the power supply to the administrative and auxiliary equipment container 100.

Figure 5:
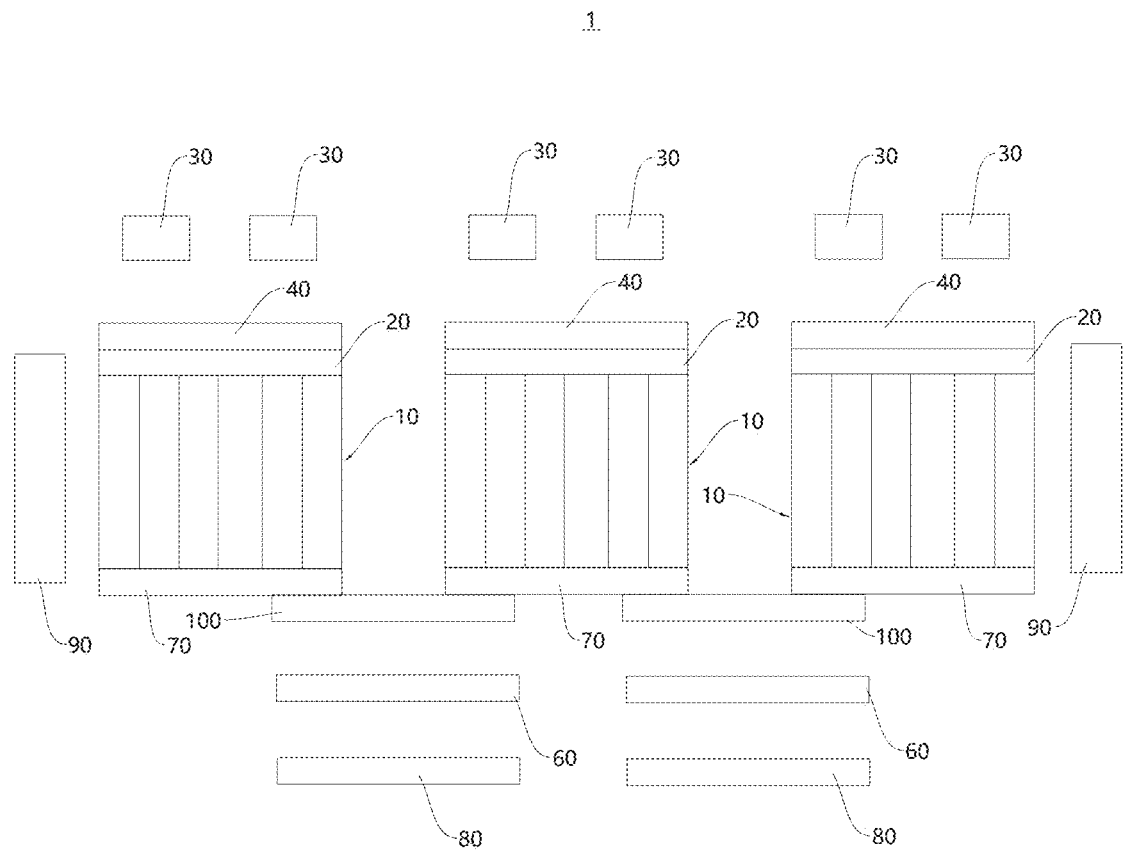
FIG. 5 is the layout diagram of each container in a data center provided by an example embodiment of the present disclosure.

Through the above technical solution, according to embodiments of the present disclosure, by integrating the server racks 11 into the IT equipment container 10, integrating the equipment needed for cooling the server racks 11 into the air-cooling equipment container 20, the hydraulic equipment container 40, the heat dissipation equipment container 30, integrating the equipment providing power into the power distribution equipment container 60, the transformer equipment container 70, the standby power equipment container 80, and integrating the equipment providing network into the network equipment container 90, etc, when constructing the data center 1, it is only need to connect and install the respective containers to complete construction of the data center 1, which can realize rapid deployment and flexible deployment of the data center 1, shorten the construction cycle and the delivery time, and reduce the related carbon emissions generated during construction of the data center 1. During the layout of respective containers in the data center 1, as shown in FIG. 5, the respective containers can be combined in any appropriate way. For example, as shown in FIG. 5, the IT equipment container 10 can be multiple in number, and multiple IT equipment containers 10 are arranged in rows. The air-cooling equipment container 20, the hydraulic equipment container 40, the heat dissipation equipment container 30 can be located on one side of multiple IT equipment containers 10, and the power distribution equipment container 60, the transformer equipment container 70, the standby power equipment container 80 and the administrative and auxiliary equipment container 100 are located on the other side of multiple IT equipment containers 10. The network equipment container 90 can be located at both ends of multiple IT equipment containers 10, and the air-cooling equipment container 20, the hydraulic equipment container 40 and the IT equipment container 10 can be directly docked to each other to reduce the floor area. In addition, the transformer equipment container 70 can be arranged closer to the IT equipment container 10 than the power distribution equipment container 60, the standby power equipment container 80, and the administrative and auxiliary equipment container 100 to facilitate power supply to the server racks 11 in the IT equipment container 10. The administrative and auxiliary equipment container 100 can be located between the transformer equipment container 70 and the power distribution equipment container 60 and between the standby power equipment container 80 and the administrative and auxiliary equipment container 100, so that it is convenient for the management personnel to inspect the IT equipment container 10, the transformer equipment container 70, the power distribution equipment container 60, the standby power equipment container 80 and the administrative and auxiliary equipment container 100.

The preferred embodiments of the present disclosure are described in detail above in combination with the accompanying drawings. However, the present disclosure is not limited to the specific details of the above embodiments. Within the scope of the technical concept of the present disclosure, a variety of simple modifications can be made to the technical solution of the present disclosure, which all fall within the protection scope of the present disclosure.

In addition, each specific technical feature described in the above specific embodiment can be combined in any suitable way without contradiction. In order to avoid unnecessary repetition, the disclosure will not describe various possible combination modes separately.

In addition, various embodiments of the present disclosure can also be arbitrarily combined, and as long as they do not violate the ideas of the present disclosure, they should also be regarded as the contents disclosed by the present disclosure.

What is claimed is:

1. A data center, comprising:
   an IT equipment container provided with a server rack therein, the IT equipment container having an IT coolant inlet port, an IT coolant outlet port, an IT air inlet port and an IT air outlet port, and the IT equipment container being prefabricated with a coolant inlet pipe connecting the IT coolant inlet port to a coolant inlet of the server rack, a coolant outlet pipe connecting the IT coolant outlet port to a coolant outlet of the server rack, and an air duct connecting the IT air outlet port to an air outlet of the server rack, and the IT air inlet port being in communication with interior of the IT equipment container;
   an air-cooling equipment container provided with air-cooling equipment therein, the air-cooling equipment container having an air-cooling air inlet port and an air-cooling air outlet port, the air-cooling air inlet port being docked with the IT air outlet port, the air-cooling air outlet port being docked with the IT air inlet port, and the air-cooling equipment being adapted to cool air flowing in from the air-cooling air inlet port, so that a temperature of air flowing out of the air-cooling air outlet port is lower than a temperature of the air flowing in from the air-cooling air inlet port,
   wherein the air-cooling equipment comprises an air-liquid heat exchanger and a fan, the air-cooling equipment container has an air-cooling coolant inlet port and an air-cooling coolant outlet port, and the air-cooling equipment container is prefabricated with a heat exchange inlet pipe connecting the air-cooling coolant inlet port to a coolant inlet of the air-liquid heat exchanger, and a heat exchange outlet pipe connecting the air-cooling coolant outlet port and a coolant outlet of the air-liquid heat exchanger, the fan is adapted to cause air flowing in from the air-cooling inlet port to flow out of the air-cooling outlet port after passing through the air-liquid heat exchanger.

2. The data center according to claim 1, wherein the data center further comprises a heat dissipation equipment container, wherein the heat dissipation equipment container is provided with heat dissipation equipment therein, the heat dissipation equipment container has a heat dissipation coolant inlet port and a heat dissipation coolant outlet port, and the heat dissipation equipment container is prefabricated with a heat dissipation pipe connecting the heat dissipation equipment to the heat dissipation coolant inlet port and the heat dissipation coolant outlet port;

wherein the heat dissipation coolant inlet port is connected to the IT coolant outlet port and the air-cooling coolant outlet port, the heat dissipation coolant outlet port is connected to the IT coolant inlet port and the air-cooling coolant inlet port, and the heat dissipation equipment is adapted to cause a temperature of coolant flowing out of the heat dissipation coolant outlet port to be lower than a temperature of coolant flowing in from the heat dissipating coolant inlet port.

3. The data center according to claim 2, wherein the heat dissipation equipment comprises a cooling tower and/or a first air conditioning unit.

4. The data center according to claim 3, wherein the heat dissipation equipment comprises a cooling tower which is an open cooling tower;

wherein the data center further comprises a hydraulic equipment container, which is provided with a first liquid-liquid heat exchanger, a first water pump and a second water pump therein; the hydraulic equipment container has a first hydraulic coolant inlet port, a second hydraulic coolant inlet port, and a first hydraulic coolant outlet port and a second hydraulic coolant outlet port, wherein the hydraulic equipment container is prefabricated with a first pipe connecting a first coolant inlet of the first liquid-liquid heat exchanger to the first hydraulic coolant inlet port, a second pipe connecting a first coolant outlet of the first liquid-liquid heat exchanger to the first hydraulic coolant outlet port, a third pipe connecting a second coolant inlet of the first liquid-liquid heat exchanger to the second hydraulic coolant inlet port, and a fourth pipe connecting a second coolant outlet of the first liquid-liquid heat exchanger to the second hydraulic coolant outlet port;

wherein the first hydraulic coolant inlet port is connected to the heat dissipation coolant outlet port, the first hydraulic coolant outlet port is connected to the heat dissipation coolant inlet port, the second hydraulic coolant inlet port is docked with the IT coolant outlet port and the air-cooling coolant outlet port, and the second hydraulic coolant outlet port is docked with the IT coolant inlet port and the air-cooling coolant inlet port;

wherein the first water pump is arranged on the first pipe and/or the second pipe; the second water pump is arranged on the third pipe and/or the fourth pipe.

5. The data center according to claim 3, wherein the heat dissipation equipment comprises a cooling tower which is a closed cooling tower;

wherein the data center further comprises a hydraulic equipment container, which is provided with a water pump therein, the hydraulic equipment container has a hydraulic coolant inlet port and a hydraulic coolant outlet port, the hydraulic equipment container is prefabricated with a fifth pipe connecting the water pump to the hydraulic coolant inlet port and the hydraulic coolant outlet port;

wherein the hydraulic coolant inlet port is connected to the heat dissipation coolant outlet port, and the hydraulic coolant outlet port is docked with the IT coolant inlet port and the air-cooling coolant inlet port.

6. The data center according to claim 1, wherein the IT equipment container is further provided with a cooling capacity distribution unit therein, the cooling capacity distribution unit comprises a second liquid-liquid heat exchanger, the coolant inlet pipe comprises a first sub coolant inlet pipe and a second sub coolant inlet pipe, and the coolant outlet pipe comprises a first sub coolant outlet pipe and a second sub coolant outlet pipe, the first sub coolant inlet pipe connects the IT coolant inlet port to a first coolant inlet of the second liquid-liquid heat exchanger, the second sub coolant inlet pipe connects a first coolant outlet of the second liquid-liquid heat exchanger to the coolant inlet of the server rack, and the first sub coolant outlet pipe connects the IT coolant outlet port to a second coolant outlet of the second liquid-liquid heat exchanger, and the second sub coolant outlet pipe connects a second coolant inlet of the second liquid-liquid heat exchanger to the coolant outlet of the server rack.

7. The data center according to claim 1, wherein the IT equipment container further has a smoke vent.

8. The data center according to claim 1, wherein the IT equipment container is provided with a power distribution cabinet therein, the IT equipment container has an IT power input port, and the IT equipment container is prefabricated with a first cable connecting the IT power input port to the power distribution cabinet;

wherein the data center further comprises a power distribution equipment container and a transformer equipment container, the power distribution equipment container is provided with power distribution equipment therein, the power distribution equipment container has a first power distribution input port and a power distribution output port, and the power distribution equipment container is prefabricated with a second cable connecting the power distribution equipment to the first power distribution input port and the power distribution output port, the transformer equipment container is provided with a transformer equipment therein, the transformer equipment container has a transformer input port and a transformer output port, and the transformer equipment container is prefabricated with a third cable connecting the transformer equipment to the transformer input port and the transformer output port;

wherein the first power distribution input port is adapted to be connected to a municipal power grid, the power distribution output port is connected to the transformer input port, and the transformer output port is connected to the IT power input port.

9. The data center according to claim 8, wherein the data center further comprises a standby power equipment container, wherein the standby power equipment container is provided with a generator therein, the standby power equipment container has a standby output port, and the standby power equipment container is prefabricated with a fourth cable connecting the generator to the standby output port;

wherein the power distribution equipment container has a second power distribution input port, the second cable connects the second power distribution input port to the power distribution equipment, and the standby power output port is connected to the second power distribution input port.

10. The data center according to claim 8, wherein the data center further comprises a network equipment container, wherein the network equipment container has a network power input port, and wherein the network power input port is connected to the transformer output port.

11. The data center according to claim 1, wherein the data center further comprises an administrative and auxiliary equipment container, in which at least one of fire-fighting equipment, a weak current room, a central control room and an office is provided.

* * * * *